US 6,603,909 B2

(12) United States Patent
Varner (10) Patent No.: US 6,603,909 B2
(45) Date of Patent: Aug. 5, 2003

(54) LASER PIGTAIL FIBER WITH INHERENT ATTENUATION CHARACTERISTIC

(75) Inventor: Wayne F. Varner, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 91 days.

(21) Appl. No.: 09/993,742

(22) Filed: Nov. 5, 2001

(65) Prior Publication Data

US 2002/0081086 A1 Jun. 27, 2002

Related U.S. Application Data

(60) Provisional application No. 60/252,289, filed on Nov. 21, 2000.

(51) Int. Cl.$^7$ .............................. G02B 6/00; G02B 6/10; G02B 6/02
(52) U.S. Cl. ...................................................... 385/123
(58) Field of Search ................................ 385/122–124, 385/147, 129–132, 50

(56) References Cited

U.S. PATENT DOCUMENTS

| 4,447,127 A | 5/1984 | Cohen et al. |
| 4,691,991 A | 9/1987 | Unger |
| 4,838,643 A | 6/1989 | Hodges et al. |
| 4,881,793 A | 11/1989 | Tarbox ..................... 350/96.21 |
| 4,896,942 A | 1/1990 | Onstott et al. |
| 4,946,250 A | 8/1990 | Gonthier et al. |
| 5,032,001 A | 7/1991 | Shang |

(List continued on next page.)

FOREIGN PATENT DOCUMENTS

| EP | 0831345 A2 | 3/1998 |
| WO | WO 97/39460 | 10/1997 |
| WO | WO 99/54767 | 10/1999 |
| WO | WO 00/42684 | 7/2000 |

OTHER PUBLICATIONS

J.R. Simpson, et al., "A Single–Polarization Fiber", Journal of Lightwave Technology, vol. LT–1, No. 2, Jun. 1983, pp. 370–374.

Tsair–Chun Liang, et al., "Optimum configuration and design of 1480–nm pumped L–band gain–flattened EDFA using conventional erbium–doped fiber", Optics Communications 183 (2000), Sep. 1, 2000, pp. 51–63.

(List continued on next page.)

Primary Examiner—Akm Enayet Ullah
(74) Attorney, Agent, or Firm—Gary L. Griswold; Peter L. Olson (57) ABSTRACT

A fiber optic telecommunication system with a pump laser and an optical amplifier is designed to stabilize the pump laser while preventing back reflections from the pump laser into the optical amplifier. The pump laser emits radiation at a shorter wavelength, while the optical amplifier emits radiation at a longer wavelength. An optical fiber is provided to connect the devices which has an ultraviolet photosensitive core, a low attenuation single mode wavelength region and a very high attenuation, longer wavelength region. The photosensitive core allows a weak Bragg grating to be written into the fiber, to stabilize the pump laser. Apparent fundamental mode cutoff is accomplished with a depressed well design to attenuate the unwanted back reflections from the pump laser into the amplifier. The pump laser is also protected from longer wavelength signal amplifier or signal laser radiation.

58 Claims, 7 Drawing Sheets

U.S. PATENT DOCUMENTS

| | | | |
|---|---|---|---|
| 5,056,888 A | | 10/1991 | Messerly et al. |
| 5,363,234 A | | 11/1994 | Newhouse et al. |
| 5,475,780 A | | 12/1995 | Mizrahi |
| 5,570,440 A | | 10/1996 | Mizrahi |
| 5,572,618 A | | 11/1996 | DiGiovanni et al. ........ 385/140 |
| 5,633,974 A | | 5/1997 | Chia ........................... 385/140 |
| 5,673,342 A | | 9/1997 | Nelson et al. ................. 385/24 |
| 5,852,690 A | | 12/1998 | Haggans et al. |
| 5,883,990 A | | 3/1999 | Sasaoka et al. |
| 6,005,999 A | * | 12/1999 | Singh et al. ................... 385/37 |
| 6,009,222 A | | 12/1999 | Dong et al. |
| 6,445,851 B1 | * | 9/2002 | Rakuljic et al. .............. 385/37 |
| 6,487,340 B2 | * | 11/2002 | Enomoto et al. ............. 385/37 |

OTHER PUBLICATIONS

Leonard G. Cohen et al., "Radiating Leaky–Mode Losses in Single–Mode Lightguides with Depressed–Index Claddings", IEEE Transactions on Microwave Theory and Techniques, vol. MTT–30, No. 10, Oct. 1982.

L. Zhang et al., "Fabrication of high–rejection—low loss single–passband filters in cladding depressed fiber by the chirped–grating concatenation method", Optics Letters, vol. 23, No. 21, Nov. 1, 1998.

Gong Yandong et al., "Novel B/Ge codoped photosensitive fiber and dispersion compensation in an 8 × 10 Gbit/s DWDM system", Optics & Laser Technology 32 (2000) 23–31.

Hans–Jurgen Hagemann et al., "The Performance of Depressed–Cladding Single–Mode Fibers with Different b/a Ratios", Journa of Lightwave Technology, vol. 9, No. 6, Jun. 1991.

J. Auge et al., "Transmission Window of Depressed Inner Cladding Single Mode Fibres", laboratoires De Marcoussis, Ninth European Conference on Optical Communication ECOC 83 ($9^{th}$; 1983; Geneva, Switzerland.

M. A. Mahdi et al., "Gain–clamped fibre amplifier using an ASE end reflector", Optics Communications 177 (2000) 195–199.

S.J. Hewlett, et al, *Coupling Characteristics of Photo–Induced Bragg Gratings in Depressed–and Matched–Cladding Fibre*, Optical & Quantum Electronics 28 (1996), Chapman & Hall; pp. 1641–1654.

* cited by examiner

LASER PIGTAIL FIBER WITH INHERENT ATTENUATION CHARACTERISTIC

The present application claims priority to commonly-owned Provisional Application Serial No. 60,252,289, filed Nov. 21, 2000 of which is hereby incorporated by reference.

FIELD OF THE INVENTION

This invention relates to a single mode optical fiber designed for connection to a laser. The fiber is transmissive at the laser's pump wavelength while strongly attenuating longer wavelengths. More particularly, the optical fiber has a depressed inner clad index profile and may be combined with a photosensitive core that permits writing of reflective gratings for laser stabilization. The fiber core is or can be substantially mode field matched to standard fibers used in optical communications devices to minimize splice losses.

BACKGROUND OF THE INVENTION

The rapid growth of fiber optic telecommnunications in recent years has led to an increasing need for technologies that support increased data transmission rates. Many such systems employ single mode optical fibers, erbium-doped fiber laser light sources, and erbium doped fiber amplifiers (EDFA) operating in a dense wavelength division multiplexing (DWDM) mode. Operating at closely spaced wavelengths primarily in the central erbium gain band (C band) between 1530 nm–1560 nm in the near infrared, these systems can communicate as many as 100 optical signal channels. (Recent work has attempted to utilize the adjacent shorter wavelength "S band" and longer wavelength "L band" regions of the erbium gain spectrum.)

In order for the erbium atoms in an erbium-doped fiber laser or erbium-doped fiber amplifier to emit photons at 1530 nm–1560 nm, they must first absorb photons with a wavelength shorter than (or equal to) the emission wavelength. These shorter wavelength photons typically come from a "pump laser," such as a semiconductor laser. In most systems, a pump laser which emits light of wavelengths around 980 nm or 1480 nm is used.

Lasers and optical amplifiers are sensitive to light that enters the laser cavity from reflections or other sources. This effect can be used to stabilize the operating wavelength of a laser, but generally the intrusion of light will destabilize the operating wavelength. In order to stabilize the operating wavelength, the reflected light must be within a specific narrow wavelength range. A weak external Bragg grating is sometimes provided to reflect some light back into the cavity thereby stabilizing the laser. Destabilization of the laser diode can occur if uncontrolled light (e.g., from reflections or from other light sources) is allowed to enter the laser cavity. Often isolators are employed to prevent such destabilizing light from reaching the laser diode.

A Bragg grating is written in a section of optical fiber by creating a periodic modulation in the refractive index of the fiber core. They are generally produced by exposing a photosensitive fiber to a periodic pattern of ultraviolet (UV) light. Their fundamental property is to reflect light over a narrow spectral range centered at a resonant wavelength. Bragg gratings can be used to reflect, filter or disperse light within an optical fiber.

Long-period gratings can also be used to provide wavelength dependent loss. A long-period grating couples optical power between two copropagating modes with very low back reflections. A long-period grating typically comprises a length of optical fiber wherein a plurality of refractive index perturbations are spaced along the fiber by a periodic distance which is large compared to the wavelength of the transmitted light. Long-period fiber grating devices selectively remove light at specific wavelengths by mode conversion. In contrast with conventional Bragg gratings which reflect light, long-period gratings remove light without reflection by converting it from a guided mode to a non-guided mode.

Gratings are commonly written in optical fibers having a fiber core that is photosensitive to ultraviolet light. Photosensitivity is generally created by doping the fiber preform core with germanium during the preform fabrication process. Germanium is typically used to increase the refractive index of the fiber core. The core doped with $GeO_2$ is often subjected to hydrogen or deuterium loading using any of several loading procedures. The hydrogen loaded fiber is then exposed to an optical interference pattern from a UV laser, which induces solid state photochemical reactions at the high light intensity "bright" fringes of the interference pattern. These photochemical reactions produce "color centers" such as electrons trapped at defect sites in the glassy material; this causes a change in the refractive index at the locations exposed to the UV light. The hydrogen, in a sense, provides an additional source of electrons for this process, and typically increases the speed and magnitude of the refractive index change. However, the excess hydrogen slowly diffuses out of the optical fiber after the grating pattern is written, resulting in a slow change in the refractive indexes in the fiber causing a change in the reflectivity and the Bragg wavelength of the Bragg grating. Gratings are often heated for a period of time after they are written, in order to "anneal" the grating and stabilize its reflectivity and Bragg wavelength at some value which will remain constant over time. Although a short term (10 minute) elevated temperature (300° C.) annealing is common to most grating fabrication to pre-age the grating, additional long term annealing of several days at a low temperature (70° C.) is commonly required in hydrogen loaded fiber gratings that have been recoated. (The protective polymer coatings on optical fibers are generally removed before writing a grating in the fiber.)

Aside from the light reflected to stabilize the operating wavelength, back reflections into lasers and amplifiers are unwanted. To prevent the unwanted back reflections, it is often necessary to install bulky and expensive optical isolators near lasers or optical amplifiers.

Single mode optical fibers having low loss transmission characteristics have existed for at least two decades. The low attenuation characteristics of the fibers are limited by scattering, absorption and bending losses in the fibers.

Optical fiber cores having a reduced refractive index and therefore requiring less core dopants were made feasible with the introduction of fiber with a depressed index cladding (DIC). These fibers are inherently lower in attenuation due to both the lower absorption losses in the less doped core and less scattering loss due to the tighter optical mode confinement. However, depressed index clad fibers suffer from a fundamental mode loss phenomena at longer wavelengths due to "tunneling" through the depressed well. Very thick depressed cladding has been used to minimize the tunneling effect, but this cladding design makes production of these fibers less economical.

The apparent fundamental mode cutoff wavelength $\lambda_{fc}$ is the smallest operating wavelength that a single mode fiber will propagate the fundamental mode where the loss is about 1 dB/m in a straight section of fiber. Beyond this wavelength, the 1st-order mode becomes lossy and radiates out of the fiber core.

The operating wavelength $\lambda_{op}$ of the optical fiber should be transmitted with very little loss. As the wavelength of light propagating in the fiber becomes longer than the apparent fundamental mode cutoff wavelength $\lambda_{fc}$, the fundamental mode becomes increasingly lossy.

As light of test wavelengths successively longer than the apparent fundamental cutoff wavelength $\lambda_{fc}$ are launched into the optical fiber, more and more power leaks through the fiber cladding. As the fundamental mode extends into the cladding material, it also becomes increasingly sensitive to bending loss even though near the $\lambda_{fc}$ the bend sensitivity is actually less than in a standard step index fiber.

A combination of preferred index levels and core/DIC diameters were discovered that assured low losses in both the 1300 nm and 1550 nm operating window of silica-based optical fibers. Typically, these depressed index clad fibers resulted in less than 0.1 dB/km of additional loss at 1550 nm compared to the 1300 nm loss level. These designs were optimized for minimizing fundamental mode loss at the longer 1550 nm operating wavelengths thereby permitting the future upgrading of these links to the longer wavelength.

The lossy characteristic for depressed index clad fiber was considered an undesirable problem and the bulk of the research has generally been directed at fiber designs that minimize its effects.

One of the few fiber applications to take advantage of the lossy fundamental mode characteristic of these fibers is the polarizing fiber design of J. R. Simpson, et al. Journal of Lightwave Technology, 1983. In this design, a special birefringence-generating elliptical cladding structure having a depressed index is used to selectively attenuate one of the two orthogonal fundamental mode polarizations, resulting in the propagation of a single polarization mode. The "fast" axis polarization tunneled through the depressed cladding and radiated out to the lossy mode stripping coating, resulting in the propagation of a single polarization. The "slow" propagating mode also suffered from the same tunneling effect but at a slightly longer wavelength, thereby providing the polarizing wavelength window. Unfortunately, only several tens of nanometers of useable bandwidth has generally been possible with these fibers, which has limited their use to narrow line width laser sources. Also, this fiber design relied heavily on controlled tight bending of the fiber in order to tune the wavelength of the useful operating window.

Another approach to achieving a lossy fiber design has been through the incorporation of certain transition metal dopants in the core. Examples of these types of fibers are described in U.S. Pat. Nos. 4,881,793, 5,572,618 and 5,633,974. Because these dopants are not very wavelength specific in their attenuating characteristics and therefore provide relatively high attenuation at the desired low loss operating wavelengths, they are generally unsuitable for pigtailing applications.

Telecommunication systems can also suffer from a loss of signal when optical fibers are joined. To this end, pieces of optical fiber are usually joined together by fusion splicing with the fiber cores aligned. However, the losses are best minimized by reducing the transition of the electromagnetic field as light moves from one fiber to another. This is called mode matching, and is conceptually similar to impedance matching in electrical circuit design. To accomplish mode matching, the mode field diameters of the joined fibers are made equal.

In discussing the step index of optical fibers, it should be noted that because of the manufacturing processes employed, real optical fibers rarely have perfectly square refractive index profiles. There may be diffusion of dopants at the boundaries of the regions, and the core may exhibit a "germanium burnoff dip" at its center. To account for this non-square index profile, there are standard algorithms for calculating an equivalent step index.

SUMMARY OF THE INVENTION

In accordance with the present invention, a single mode optical fiber is provided that operates with very low attenuation at the pump wavelength while providing very high attenuation at certain longer wavelengths. Typically, the attenuation is less than about 0.050 dB/meter at the pump wavelength and greater than about 1 dB/meter at the absorption wavelength.

The optical fiber includes a core region that is photosensitive, thereby permitting the writing of reflective gratings in the fiber for pump stabilization. The photosensitivity can be made sufficient to eliminate the need for $H_2$ or $D_2$ loading or other photosensitizing processes prior to the grating writing process.

The fiber can be easily spliced or connected to common wavelength selective couplers and other pigtail fibers with minimal losses.

These attributes are obtained in a DIC single mode fiber design having a core doped with photosensitizing compositions and having a mode field diameter that closely matches or can be made to closely match adjoining fibers. More specifically, the fiber design has a raised index between about 0.000 and 0.010, a depressed index between about 0.002 and 0.015 and a ratio of DIC diameter to core diameter within the range of about 2 to about 10, preferably within the range of about 2 to about 7, more preferably within the range of about 2 to about 5.5, and most preferably within the range of about 2.6 to about 5.1. Photosensitizing core compositions may include $GeO_2/SiO_2$ and $GeO_2$ co-doped with $B_2O_3/SiO_2$. The DIC composition may be a fluorine doped silica composition or a boron doped silica composition.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

FIG. 9 shows an optical communication system.

DETAILED DESCRIPTION

In the following detailed description of the preferred embodiments, reference is made to the accompanying drawings that form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

Figure 1:
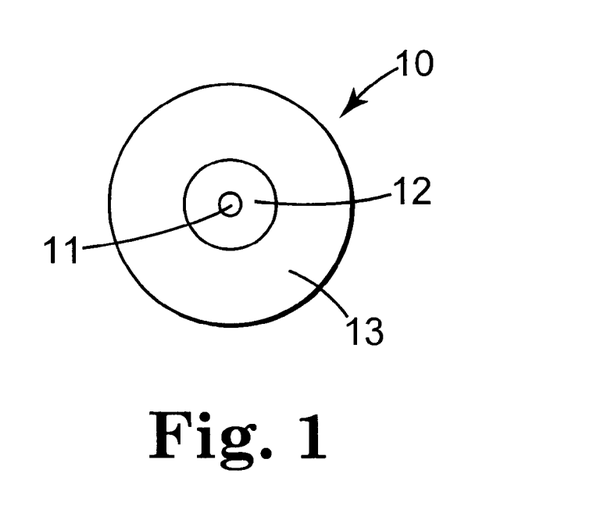
FIG. 1 shows a cross-section of a depressed inner clad fiber.

Referring to the drawings, FIG. 1 shows a simple cross-section of a depressed inner clad single mode fiber 10, a core region 11, a depressed inner clad region 12 and an outer clad region 13. The primary difference between this design and a standard step index single mode fiber is that, in the standard design, the index of region 12 would be matched to the index of the outer cladding.

Figure 2:
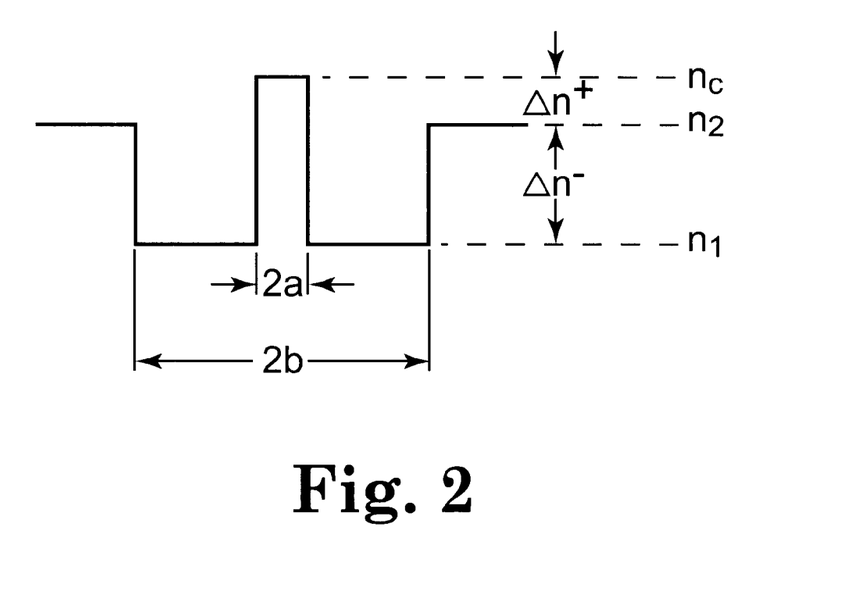
FIG. 2 shows the general index/geometry profile of the fiber shown in FIG. 1.

FIG. 2 shows both the equivalent step index profile of the DIC fiber as well as the critical geometric dimensions. The core region 11 of the DIC fiber has an index of $n_c$. The outer clad region 13 has an index of $n_2$. The index of the core region 11 is greater than the index of the outer clad region 13. The difference between the index of the core region 11 and the index of the outer clad region 13 is called the raised index, $\Delta n^+$, i.e., $(n_c - n_2 = \Delta n^+)$.

The depressed inner cladding region 12 has an index of $n_1$. The index of the depressed inner clad region 12 is less than the index of the outer cladding 13. The difference between the index of the inner clad region 12 and the index of the outer cladding 13 is called the depressed index, $\Delta n^-$, i.e., $(n_2 - n_1 = \Delta n^-)$.

The diameter of the core is 2a while the diameter of the depressed inner cladding is 2b. In the preferred embodiment, 2b is typically greater than twice 2a.

To set the core index $n_c$ greater than the outer cladding index, $n_2$, the core silica contains index raising dopants such as: $P_2O_5$; $GeO_2$; co-dopants $GeO_2$ and $B_2O_3$; $P_2O_5$ and $B_2O_3$; or $GeO_2$, $P_2O_5$ and $B_2O_3$. Setting the index of the inner clad index $n_1$ can be achieved by doping silica with either fluorine or boron and may include other co-dopants such as $P_2O_5$ or $GeO_2$. The outer cladding index $n_2$ typically matches silica and may be a pure silica composition or a silica composition containing fluorine or boron and co-doped with $P_2O_5$ or $GeO_2$.

The core region 11 may be made photosensitive with the use of germanium or boron dopants. A fiber is photosensitive when at least one of the material components comprising the fiber permanently changes physical properties upon exposure to actinic radiation. Preferably, the refractive index of the material is the property that is permanently affected. Making the core region photosensitive allows Bragg gratings to be written into the fiber, by exposing a region of the fiber to a pattern of ultraviolet light. In the alternative, long period gratings can be written in place of the Bragg gratings.

Figure 3:
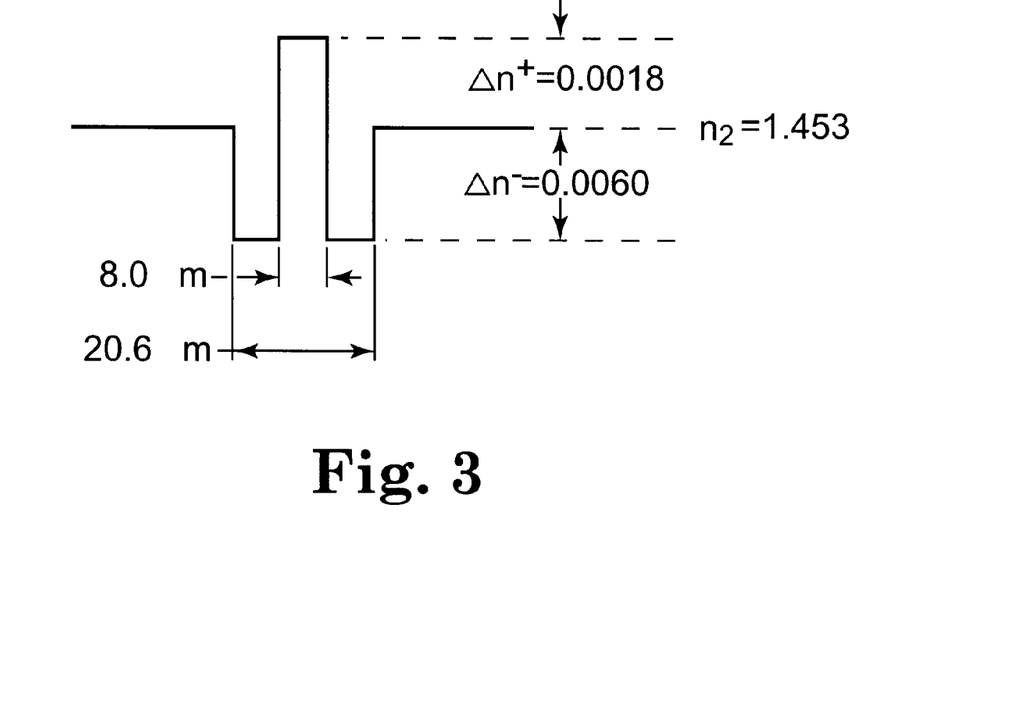
FIG. 3 shows the specific index/geometry profile of a first embodiment of the inventive fiber.

The index and geometry profile of a first preferred embodiment of the invention is shown in FIG. 3. The first preferred embodiment has a raised index $\Delta n^+$ of 0.0018, a depressed index $\Delta n^-$ of 0.0060, a core diameter 2a of 8.0 µm and a depressed inner clad diameter of 21 µm. A fiber having a small depressed inner clad to core diameter ratio such as this is sometimes referred to as a "W" fiber and represents a narrow depressed well case.

Figure 5:
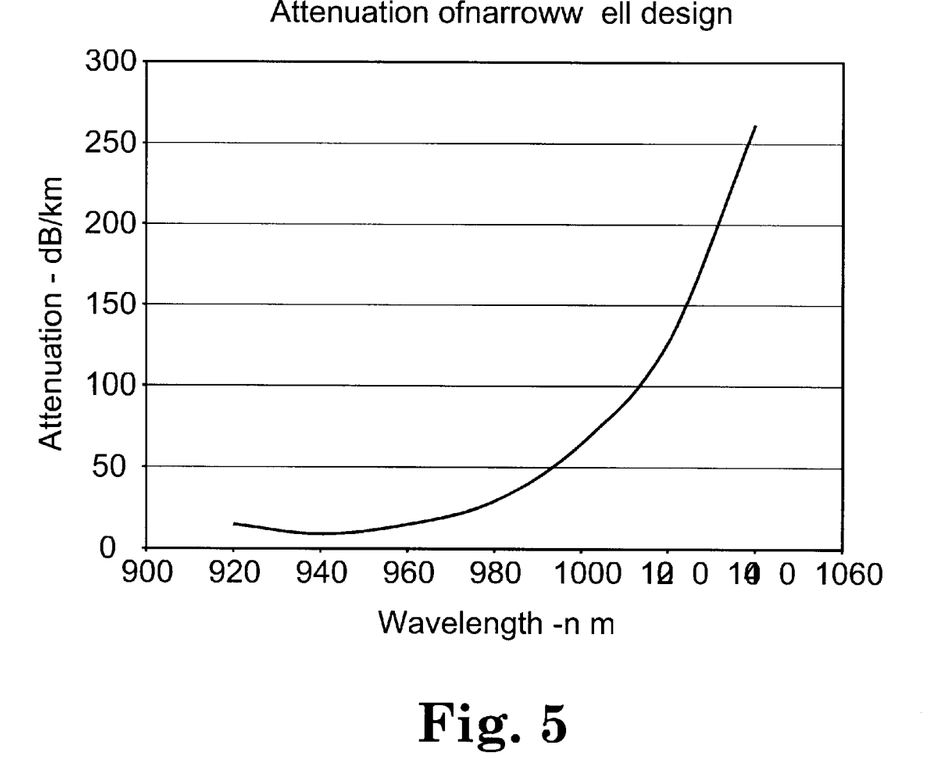
FIG. 5 shows the attenuation characteristic of the first embodiment of the inventive fiber near the operating wavelength $\lambda_{op}$.

This fiber has an outer diameter of 125 µm, resulting in a second mode cutoff wavelength of 930 nm and a mode field diameter of 6.4 µm when measured at 980 nm. The attenuation characteristics near the operating wavelength $\lambda_{op}$=980 nm are shown in FIG. 5. Although an acceptable attenuation of about 60 dB/km can be achieved for a typical one meter pigtail length, it is clear that the fundamental mode may show tunneling tendencies at the operating wavelength, and therefore does not have a flat, low loss operating region.

At 1550 nm, the attenuation of a straight piece of fiber may exceed 10 dB/meter. This fiber represents one of the limits of the DIC fiber design space. A smaller well width would result in even higher operating wavelength losses, as the fundamental mode tunneling would have been even stronger. Another problem with this design is the high sensitivity of the operating wavelength attenuation to slight variations in manufacturing conditions during fiber production. For example, if the $2^{nd}$ mode cutoff were to shift 50 nm to 880 nm, the attenuation in the 980 nm window would increase to about 200 dB/km or 0.2 dB for a one meter pigtail. This would be an unacceptable additional insertion loss for many applications.

Figure 4:
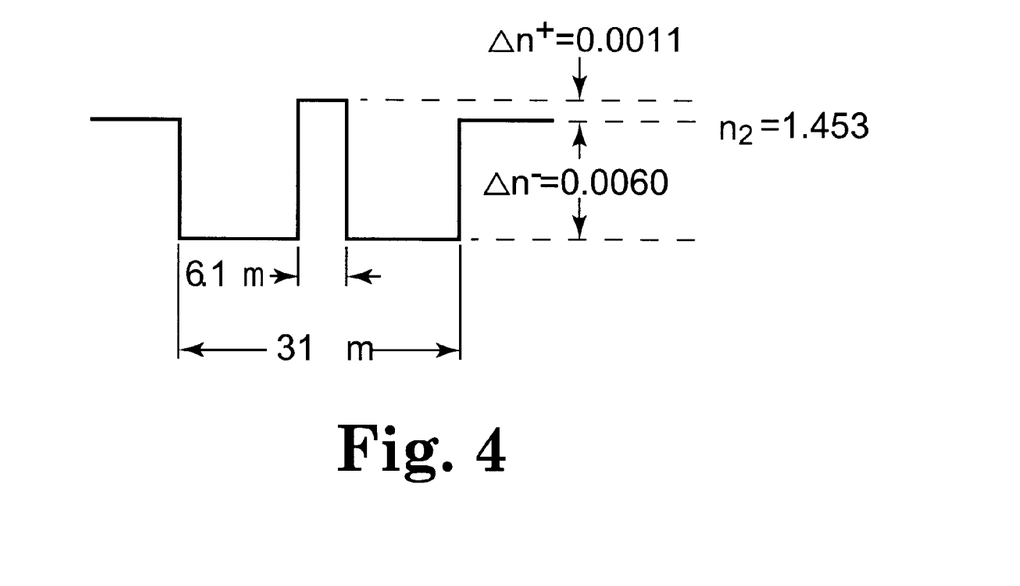
FIG. 4 shows the specific index/geometry profile of a second embodiment of the inventive fiber.
Figure 6:
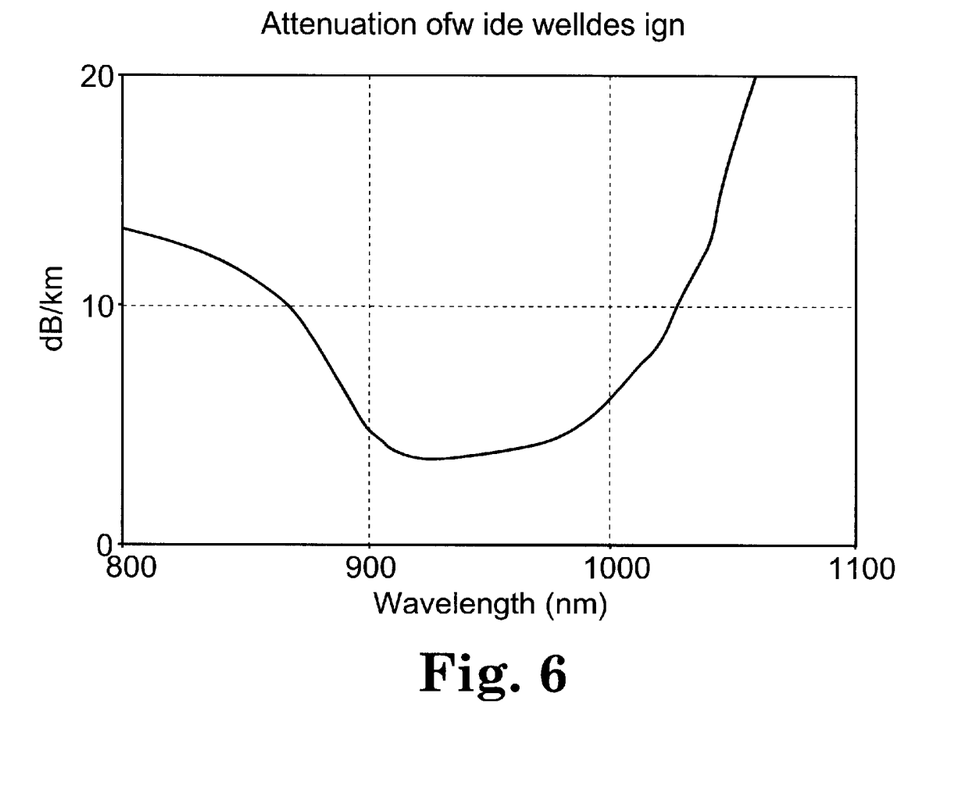
FIG. 6 shows the attenuation characteristic of the second embodiment of the inventive fiber near the operating wavelength $\lambda_{op}$.

A second preferred embodiment is represented by the refractive index/geometry profile shown in FIG. 4. In this second preferred embodiment, the core has a raised index $\Delta n^+$ of 0.0011, a depressed index $\Delta n^-$ of 0.0060, a core diameter 2a of 6.1 µm and a depressed inner clad diameter of 31 µm. This wider depressed well design is still narrower than typical DIC fiber used in long transmission link applications. This fiber has a second mode cutoff of 920 nm and a mode field diameter at 980 nm of 5.9 µm which is identically matched to Flexcore 1060, a common pigtailing fiber made by Corning, Inc. The attenuation characteristic of this fiber near the operating wavelength $\lambda_{op}$=980 nm is shown in FIG. 6. The attenuation in the pump wavelength region of 970–1000 nm is less than 10 dB/km and is essentially flat. A 40 nm shift in the $2^{nd}$ mode cutoff of this fiber to 880 nm would result in an increase in the attenuation of about 4 dB/km to about 9 dB/km—an insignificant increase of 0.004 dB for a one meter pigtail.

Figure 7:
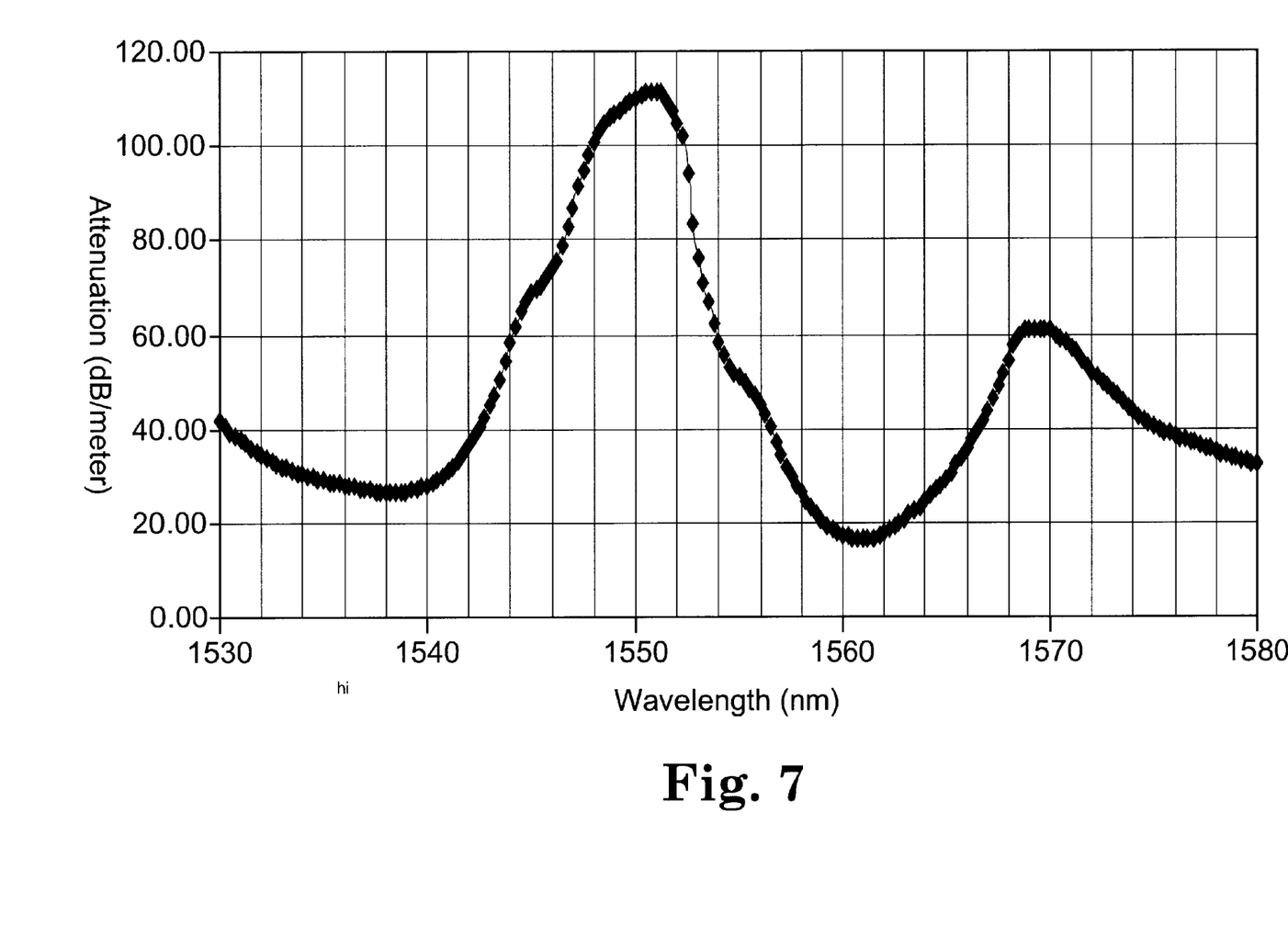
FIG. 7 shows the attenuation characteristic of the second embodiment of the longer high attenuating wavelength $\lambda_{hi}$.

The long wavelength attenuation characteristic is shown in FIG. 7 and shows that the attenuation of wavelengths $\lambda_{hi}$ over the erbium "C" band is a minimum of 15 dB/meter in a straight fiber configuration.

Low loss splicing to conventional pigtailing fibers such as SMF 28 and Flexcore 1060 (made by Corning, Inc.) is needed to make the fiber design practical. Splice losses of less than 0.12 dB have been measured on these designs using conventional fusion splicing technology. This low loss is attributable to the excellent mode match possible with these DIC designs. For designs having less than perfect mode matches, it is possible to use special fusion splicing programs that provide enough core diffusion to effectively mode match the fibers in the local region of the splice. A slightly mismatched design resulted in average splice losses of less than 0.05 dB when spliced to Flexcore 1060 and SMF 28.

Gratings having 3% reflectivity (0.13 dB) can be written in non-$H_2$ loaded fiber in accordance with the invention in about 50 seconds. Since a normal pump stabilizing grating requires only about 2–3% reflectivity, the fiber is sufficiently photosensitive for non-$H_2$ loaded grating fabrication. A Bragg grating of 3% reflectivity was written in a hydrogen loaded fiber of this design in less than 10 seconds, while a Flexcore 1060 fiber similarly loaded with $H_2$ required about 60 seconds to achieve a comparable reflectivity.

Another feature of the fiber design is the incorporation of boron in the core to create a fiber that has a high UV photosensitivity. Boron in a co-doped germanium silicate composition creates the necessary high UV photosensitivity while providing a relatively low refractive index in the core needed for these DIC designs. The low refractive index of the core counters the numerical aperture increase that results from the depressed well design. This fiber design permits mode matching of the fiber to conventional fibers.

Very strong gratings can be written into these types of fiber. For example, a 45 dB reflector (37 dB after annealing) was written into a 1550 um operating wavelength fiber drawn from a milled version of the same preform used for the 980 nm fiber of the first embodiment. The fiber was $H_2$ loaded for 4 days at 70° C. and 2000 psi. It took only 5 minutes using a 270 mJ/cm2 pulse fluence, 50 Hz pulse rate, from a 248 nm KrF excimer laser to achieve this grating strength in a 3 mm long grating.

In applications where the pump pigtail fiber operating wavelength $\lambda_{op}$ is relatively close to the wavelength which is to be strongly attenuated, as for example when a 1480 nm pump laser is used to pump an erbium-doped fiber amplifier operating in L-band (1570–1610 nm), it may be desirable to use the pigtail fiber in a coiled configuration having a controlled bend radius. The controlled bending can be used to steepen the loss vs. wavelength curve at the apparent fundamental mode cutoff wavelength. This can increase the difference in optical loss between the closely spaced transmission and loss wavelengths. (See for example, Liang, et al., "Optimum configuration and design of 1480-nm pumped L-band gain-flattened EDFA using conventional erbium-doped fiber", Optics Communications 183 (2000) 51–63, and Simpson, et al., "A Single-Polarization Fiber", Journal of Lightwave Technology, Vol. LT-1, No. 2, June 1983.)

Figure 8:
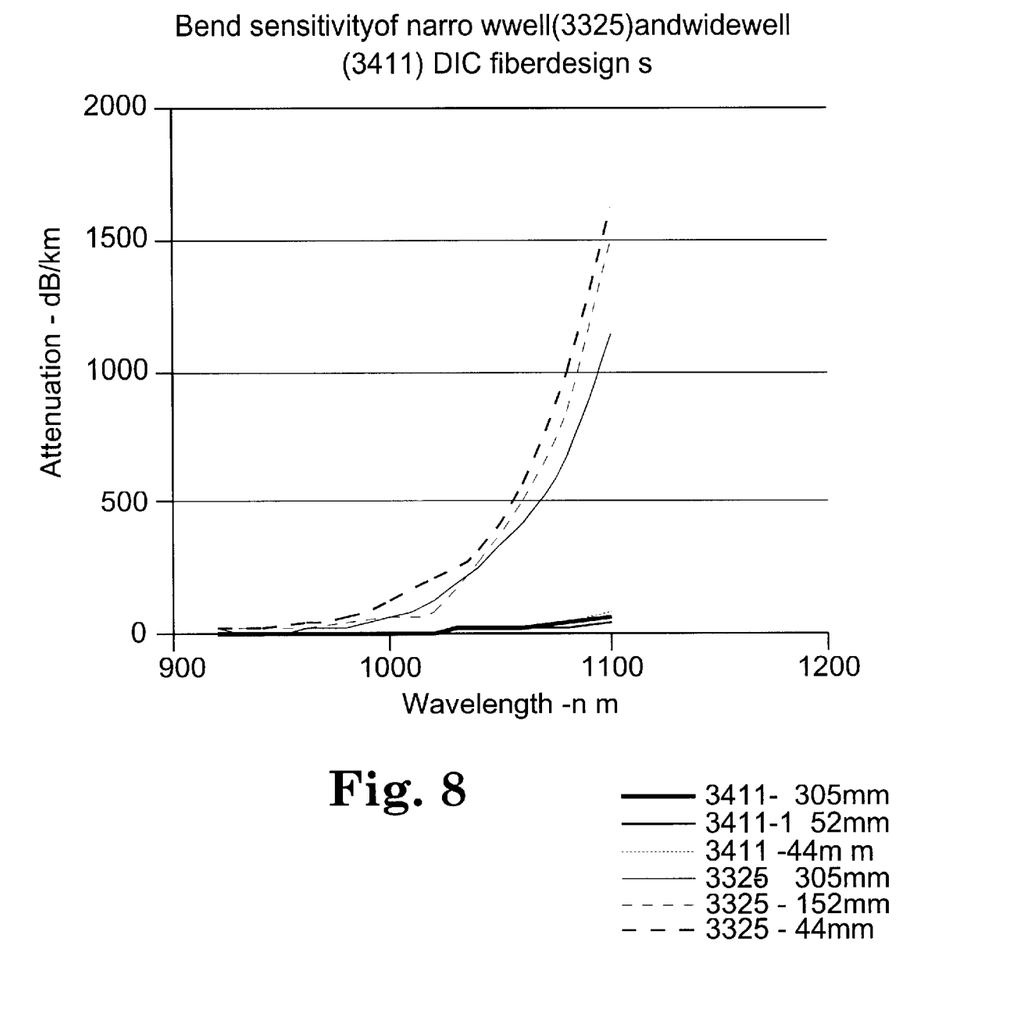
FIG. 8 shows the bend sensitivity of the attenuation characteristic near the operating wavelength $\lambda_{op}$.

FIG. 8 compares the attenuation vs. wavelength of the first embodiment (narrow depressed index well design, 3M fiber drum number 3325, whose effective step index profile is shown in FIG. 3) with that of the second embodiment (wide depressed well design, 3M fiber drum number 3411, whose effective step index profile is shown in FIG. 4). For each test, approximately 300 m of the sample fiber was wrapped around a spool having the specified diameter (305 mm, 152 mm, or 44 mm). The attenuation vs. wavelength was then measured for each spool. The graph shows that the attenuation vs. wavelength increases much more rapidly for the narrow depressed index well design (2b/2a=2.6) than for the wider well design (2b/2a=5.1) as the input wavelength is increased beyond the intended operating wavelength (approximately 980 nm). Other test results (not shown) indicated that the wide well design fiber attenuation did not exceed 200 dB/km until about 1150 nm, and the attenuation increased greatly beyond about 1200 nm. This indicates that a wider depressed well design provides a wider low loss region around the operating wavelength, thus permitting a greater tolerance for lot-to-lot variations in manufacturing processes. The attenuation vs. wavelength curves for the narrow depressed well design noticeably demonstrate an increase in attenuation and a steeper attenuation curve for smaller bend radii. This effect could be used to advantage if the wavelength which must be strongly attenuated lies very close to the intended operating wavelength.

FIG. 9 depicts a fiber optic communication system 900. Source 910 emits radiation at an operating wavelength of $\lambda_{op}$. For example, the source 910 would preferably be a pump laser operating at a wavelength $\lambda_{op}$ in the range of 950–1050 nm. In an alternate embodiment, the pump laser operates at a wavelength $\lambda_{op}$ in the range 1450–1510 m. The source 910 is optically connected to an accepting device 930 through an optical fiber 920. For example, the accepting device 930 could be a laser, such as an Erbium-Doped Fiber Laser (EDFL), as shown in FIGS. 9a and 9b, or an amplifier, such as an Erbium-Doped Fiber Amplifier (EDFA), as shown in FIGS. 9c and 9d. The accepting device could be forward pumped, as shown in FIGS. 9a and 9c, or counter-pumped, as shown in FIGS. 9b and 9d.

The accepting device 930 is generally designed to receive radiation at the operating wavelength $\lambda_{op}$. The accepting device 930 processes the radiation received at operating wavelength $\lambda_{op}$ through optical fiber 920 and outputs signal radiation at a signal wavelength $\lambda_s$ through an output optical fiber 940 to an optical receiver 980. The optical receiver 980 could include wavelength demultiplexing devices, optical-to-electrical signal conversion devices, or other similar optical receiving devices known in the art. The wavelength of the radiation generated by accepting device 930 $\lambda_s$, is typically longer than the operating wavelength $\lambda_{op}$ of source 910.

The optical communication system may also include signal source 990 outputting a signal at wavelength $\lambda_s$ through optical fiber 950 to optical coupler 960. The signal source 990 could be, for example, a semiconductor laser (a laser diode) or an erbium-doped fiber laser which has an external signal modulator, or other similar signal sources known in the art.

Figure 9A:
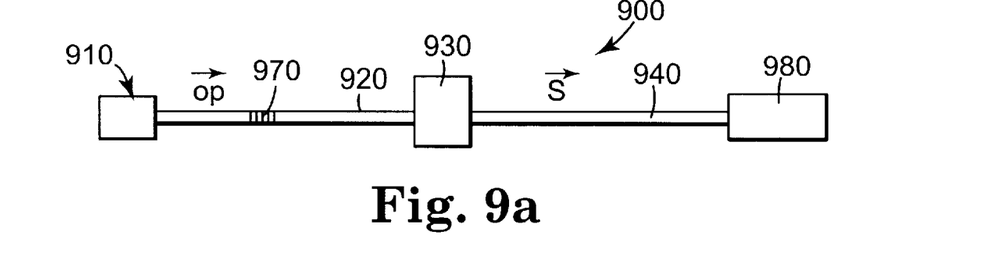
FIG. 9a shows an optical communication system including a forward pumped erbium-doped fiber laser.

As shown in FIG. 9a, the accepting device 930 is a forward pumped optical laser. Radiation at operating wavelength $\lambda_{op}$ is emitted from the source 910 through optical fiber 920. Optical fiber 920 preferably includes a Bragg grating 970 which reflects back a small percentage of the radiation to source 910. The remainder of the radiation is received by the optical laser, which emits radiation at a signal wavelength $\lambda_s$ through optical fiber 940 to optical receiver 980. Optical fiber 920 attenuates radiation transmitted at wavelength $\lambda_s$.

Figure 9B:
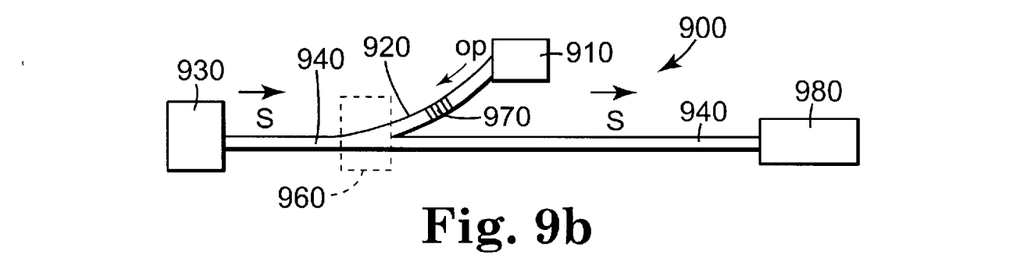
FIG. 9b shows an optical communication system including a counter-pumped erbium-doped fiber laser.

As shown in FIG. 9b, the accepting device 930 is a counter pumped optical laser. Radiation at operating wavelength $\lambda_{op}$ is emitted from the source 910 through optical fiber 920. Optical fiber 920 preferably includes a Bragg grating 970 which reflects back a small percentage of the radiation to source 910. The remainder of the radiation is received by an optical coupler 960, which transmits the radiation at the operating frequency to the optical laser through the output fiber 940. Coupling device 960 could be, for example, a wavelength-selective fiber optic coupler as is known in the art.

Figure 9C:
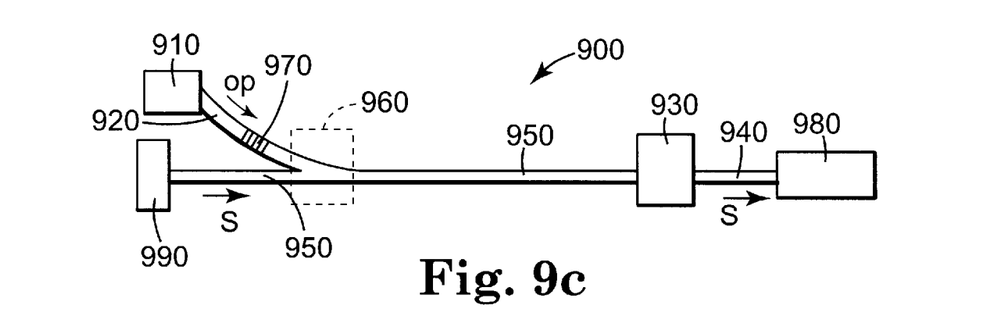
FIG. 9c shows an optical communication system including a forward pumped erbium-doped fiber amplifier.

As shown in FIG. 9c, the accepting device 930 is a forward pumped optical amplifier. An input fiber 950 carries an optical signal at wavelength $\lambda_s$ from a signal source 910 to the amplifier 930. Radiation at operating wavelength $\lambda_{op}$ in fiber 920 from light source 910 and incoming signal radiation at signal wavelength $\lambda_s$ from input fiber 950 can be combined at the same input port of the optical amplifier by means of a coupling device 960.

Figure 9D:
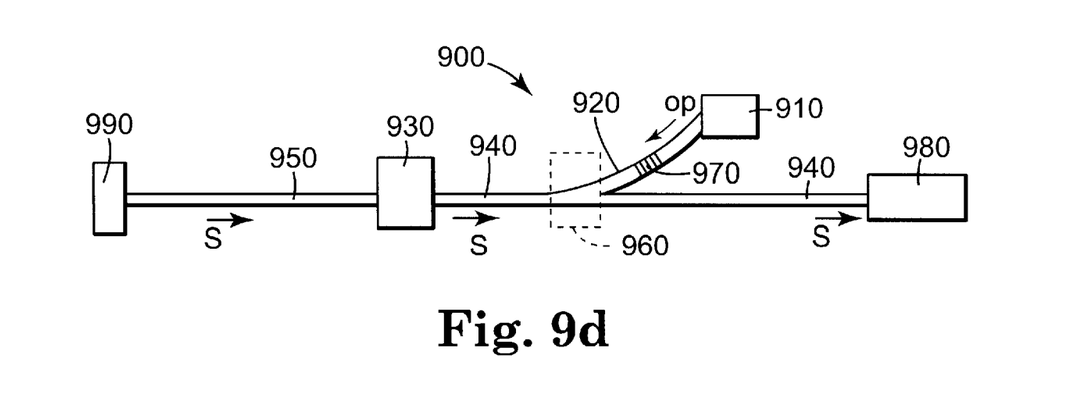
FIG. 9d shows and optical communication system including a forward pumped erbium-doped fiber amplifier.

In another embodiment shown in FIG. 9d, accepting device 930 is a "counter pumped" optical amplifier. Radiation at wavelength $\lambda_{op}$ from light source 910 is transmitted through fiber 920 into coupling device 960 and subsequently enters the optical amplifier through the output optical fiber 940 to optical receiver 980.

In all of these configurations, it is desirable that wavelengths near the signal wavelength $\lambda_s$ be strongly attenuated in the pump laser pigtail, optical fiber 920. Such longer wavelength attenuation will prevent back reflections of light from accepting device 930 near signal wavelength $\lambda_s$ from causing unstable operation of the accepting devices 930. Strongly attenuating wavelength $\lambda_s$ in fiber 920 will also protect light source 910 from instability or damage (particularly in the case of a "counter pumped" amplifier or laser).

The optical fiber 920 may optionally have a reflective Bragg grating 970 written into it. This Bragg grating preferably reflects about 2% of the radiation at $\lambda_{op}$ emitted by the light source 910 back to the light source 910. This reflected radiation serves to help stabilize the wavelength of the output of the light source.

Preferably, the accepting device 930 is an amplifier or laser that includes erbium ions incorporated into a glass matrix. When the amplifier receives the radiation from the light source 910, the radiation excites the erbium atoms with the shorter wavelength, higher energy photons emitted by the light source 910. The radiation raises many atoms to an excited state, creating population inversion. The incoming signal radiation causes stimulated emission, as in a laser, producing an amplified signal for output.

Other possible pump wavelengths for other fiber designs could also use this concept, but in the preferred embodiments, the pump wavelength will be spaced away from the amplifying wavelength range. This may also be useful in certain sensor applications where high attenuation of longer wavelength signals is desired and an isolator or a filter could be eliminated.

Although the invention has been described with a certain degree of particularity, it should be recognized that elements thereof may be altered by persons skilled in the art without departing from the spirit and scope of the invention. The invention is limited only by the following claims and their equivalents.

What is claimed is:

1. An optical fiber having an operating wavelength $\lambda_{op}$, an apparent fundamental mode cutoff wavelength $\lambda_{fc}$, and an attenuation wavelength $\lambda_a$; wherein $\lambda_{op} < \lambda_{fc} < \lambda_a$, and wherein the optical loss of the fiber at $\lambda_a$ is at least 1 dB/m greater than the loss at $\lambda_{op}$.

2. The optical fiber of claim 1, wherein the optical loss at $\lambda_{op}$ is less than 100 dB/km.

3. The optical fiber of claim 1, wherein the optical loss at $\lambda_{op}$ is less than 10 dB/km.

4. The optical fiber of claim 1, wherein the optical loss at $\lambda_{op}$ is less than 4 dB/km.

5. The optical fiber of claim 1, wherein the optical loss of the fiber at $\lambda_a$ is at least 1 dB/m greater than the loss at $\lambda_{op}$ when the fiber is straight.

6. The optical fiber of claim 1, wherein the fiber is a single mode fiber at the operating wavelength $\lambda_{op}$.

7. The optical fiber of claim 6 in combination with a second optical fiber, wherein the optical fiber is spliced to the second optical fiber, and wherein the optical fiber has a mode field diameter at the operating wavelength $\lambda_{op}$ that is within ±10% of the mode field diameter of the second optical fiber at the operating wavelength $\lambda_{op}$.

8. The optical fiber of claim 7, wherein the second optical fiber is a commercial telecommunications fiber.

9. The optical fiber of claim 8, wherein the optical fiber is fusion spliced to the second optical fiber such that the optical loss attributable to the splice is no more than 0.2 dB.

10. The optical fiber of claim 1, wherein the optical loss of the fiber at all wavelengths greater than $1.05\,\lambda_{fc}$ is at least 1 dB/m greater than the loss at $\lambda_{op}$.

11. The optical fiber of claim 1, wherein the optical fiber has a core surrounded by a cladding, and wherein the core is photosensitive.

12. The optical fiber of claim 11, wherein the optical fiber core and cladding have substantially equal photosensitivity.

13. The optical fiber of claim 11, wherein the optical fiber core is sufficiently photosensitive that a 2% reflective Bragg grating refractive index structure may be written in the fiber by exposing it to an interference pattern from an ultraviolet laser source for less than about 5 minutes without first hydrogen loading the optical fiber.

14. The optical fiber of claim 11, further comprising a refractive index grating structure.

15. The optical fiber of claim 14, wherein said refractive index grating structure is selected from the group consisting of Bragg gratings and long period gratings.

16. The optical fiber of claim 1, comprising:
   a core region with a diameter within the range of about 4.0 μm to about 10.0 μm;
   a depressed inner clad region with a diameter within the range of about 8 μm to about 50 μm; and
   an outer clad region;
wherein the optical fiber has a raised refractive index within the range of about 0 to about 0.010 and a depressed refractive index within the range of about 0.002 to about 0.015.

17. The optical fiber of claim 16, wherein the DIC to core diameter ratio is within the range of about 2.0 to about 7.0.

18. An optical fiber filter adapted for use in a communications system, comprising:
   an optical fiber having an operating wavelength $\lambda_{op}$, an apparent fundamental mode cutoff wavelength $\lambda_{fc}$, and an attenuation wavelength $\lambda_a$;
   wherein $\lambda_{op} < \lambda_{fc} < \lambda_a$, and wherein the optical loss of the fiber at $\lambda_a$ is at least 1 dB/m greater than the loss at $\lambda_{op}$.

19. The optical fiber filter of claim 18, wherein the optical loss at $\lambda_{op}$ is less than 100 dB/km.

20. The optical fiber filter of claim 18, wherein the optical loss at $\lambda_{op}$ is less than 10 dB/km.

21. The optical fiber filter of claim 18, wherein the optical loss at $\lambda_{op}$ is less than 4 dB/km.

22. The optical fiber filter of claim 18, wherein the optical loss of the fiber at $\lambda_a$ is at least 1 dB/m greater than the $\lambda_{op}$ when the fiber is straight.

23. The optical fiber filter of claim 18, wherein the filter is disposed within the communications system in the optical path between a first source which emits radiation at wavelength $\lambda_{op}$ and a second source which emits radiation at wavelength $\lambda_a$.

24. The optical fiber filter of claim 23, wherein $\lambda_{op}$ is within the range of about 950 nm to about 1010 nm.

25. The optical fiber filter of claim 23, wherein $\lambda_{op}$ is within the range of about 1450 nm to about 1510 nm.

26. The optical fiber filter of claim 23, wherein $\lambda_{op}$ is within the range of about 1520 nm to about 1610 nm.

27. The optical fiber filter of claim 23, wherein the first source is a first laser and the second source is an optical amplifier.

28. The optical fiber filter of claim 27, wherein the optical amplifier is an erbium-doped fiber amplifier.

29. The optical fiber filter of claim 23, wherein the first source is a first laser and the second source is an second laser.

30. The optical fiber filter of claim 29, wherein the second laser is an erbium-doped fiber laser.

31. The optical fiber filter of claim 23, wherein the optical fiber further comprises a refractive index grating structure.

32. The optical fiber filter of claim 31, wherein said refractive index grating structure is selected from the group consisting of Bragg gratings and long period gratings.

33. The optical fiber filter of claim 32, wherein said refractive index grating structure is a Bragg grating which reflects at least a portion of the light of wavelength $\lambda_{op}$, and further wherein the first source emits light of wavelength $\lambda_{op}$.

34. The optical fiber filter of claim 33, wherein the Bragg grating is adapted to function as an external cavity reflector to stabilize the output of the first source at wavelength $\lambda_{op}$.

35. The optical fiber filter of claim 18, wherein the DIC to core diameter ratio is within the range of about 2.0 to about 7.0.

36. A pump laser assembly, comprising:
   a first laser equipped with an optical fiber pigtail, said optical fiber pigtail having an operating wavelength $\lambda_{op}$, an apparent fundamental mode cutoff wavelength $\lambda_{fc}$, and an attenuation wavelength $\lambda_a$;
   wherein $\lambda_{op} < \lambda_{fc} < \lambda_a$, and wherein the optical loss of the optical fiber of the fiber pigtail at $\lambda_a$ is at least 1 dB/m greater than the loss at $\lambda_{op}$.

37. The pump laser assembly of claim 36, wherein the optical loss at $\lambda_{op}$ is less than 100 dB/km.

38. The pump laser assembly of claim 36, wherein the optical loss at $\lambda_{op}$ is less than 10 dB/km.

39. The pump laser assembly of claim 36, wherein the optical loss at $\lambda_{op}$ is less than 4 dB/km.

40. The pump laser assembly of claim 36, wherein the optical loss of the fiber pigtail at $\lambda_a$ is at least 1 dB/m greater than the loss at $\lambda_{op}$ when the fiber is straight.

41. The pump laser assembly of claim 36, wherein the optical fiber contains a Bragg grating.

42. The pump laser assembly of claim 41, wherein the Bragg grating functions as an external cavity reflector to stabilize the output of the laser at wavelength $\lambda_{op}$.

43. The pump laser assembly of claim 36, adapted to pump a first source which emits radiation at wavelength $\lambda_a$.

44. The pump laser assembly of claim 43, wherein said first source is a second laser.

45. The pump laser assembly of claim 43, wherein said first source is an optical amplifier.

46. The pump laser assembly of claim 36, wherein the DIC to core diameter ratio is within the range of about 2.0 to about 7.0.

47. A fiber optic communication system, comprising:
   a source which emits radiation at operating wavelength $\lambda_{op}$;
   an accepting device adapted to receive radiation at wavelength $\lambda_{op}$; and
   an optical fiber filter in optical communication with said light source and said accepting device;
   wherein said optical fiber filter comprises an optical fiber having an operating wavelength $\lambda_{op}$, an apparent fundamental mode cutoff wavelength $\lambda_{fc}$, and an attenuation wavelength $\lambda_a$, wherein $\lambda_{op} < \lambda_{fc} < \lambda_a$, and wherein the optical loss of the fiber at $\lambda_a$ is at least 1 dB/m greater than the loss at $\lambda_{op}$.

48. The fiber optic communication system of claim 47, wherein the optical loss at $\lambda_{op}$ is less than 100 dB/km.

49. The fiber optic communication system of claim 47, wherein the optical loss at $\lambda_{op}$ is less than 10 dB/km.

50. The fiber optic communication system of claim 47, wherein the optical loss at $\lambda_{op}$ is less than 4 dB/km.

51. The fiber optic communication system of claim 47, wherein the optical loss of the fiber at $\lambda_a$ is at least 1 dB/m greater than the loss at $\lambda_{op}$ when the fiber is straight.

52. The fiber optic communication system of claim 47, wherein the optical loss of the fiber at all wavelengths greater than 1.05 $\lambda_{fc}$ is at least 1 dB/m greater than the loss at $\lambda_{op}$.

53. The fiber optic communication system of claim 47, wherein the optical fiber further comprises a refractive index grating structure.

54. The fiber optic communication system of claim 53, wherein the refractive index grating structure is selected from the group consisting of Bragg gratings and long period gratings.

55. The fiber optic communication system of claim 54, wherein the Bragg grating is adapted to function as an external cavity reflector to stabilize the output of the light source at wavelength $\lambda_{op}$.

56. The fiber optic communication system of claim 47, wherein the source is a pump laser and the accepting device is selected from the group consisting of an erbium-doped fiber laser and an erbium-doped fiber amplifier.

57. The fiber optic communication system of claim 47, wherein the optical fiber comprises:
   a core region with a diameter within the range of about 4.0 $\mu$m to about 10.0 $\mu$m;
   a depressed inner clad region with a diameter within the range of about 8.0 $\mu$m to about 50 $\mu$m; and
   an outer clad region;
   wherein the optical fiber has a raised refractive index within the range of about 0 to about 0.010 and a depressed refractive index within the range of about 0.002 to about 0.015.

58. The fiber optic communication system of claim 47, wherein the DIC to core diameter ratio is between about 2.0 and 7.0.

* * * * *

UNITED STATES PATENT AND TRADEMARK OFFICE
CERTIFICATE OF CORRECTION

PATENT NO.    : 6,603,909 B2
DATED         : August 5, 2003
INVENTOR(S)   : Varner, Wayne F.

It is certified that error appears in the above-identified patent and that said Letters Patent is hereby corrected as shown below:

Column 7,
Line 28, delete "$\mu$m" and insert -- nm -- therefor.

Column 8,
Line 16, delete "1450-1510 m" and insert -- 1450-1510 nm -- therefor.

Column 10,
Line 57, insert -- loss at -- before "$\lambda_{op}$".

Signed and Sealed this

Third Day of August, 2004

JON W. DUDAS
*Acting Director of the United States Patent and Trademark Office*